United States Patent
Shin

(10) Patent No.: US 11,056,176 B2
(45) Date of Patent: Jul. 6, 2021

(54) MEMORY DEVICE AND OPERATING METHOD THEREOF

(71) Applicant: SK hynix Inc., Gyeonggi-do (KR)

(72) Inventor: Jae Hyeon Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/712,398

(22) Filed: Dec. 12, 2019

(65) Prior Publication Data

US 2020/0294571 A1 Sep. 17, 2020

(30) Foreign Application Priority Data

Mar. 14, 2019 (KR) .......................... 10-2019-0029522

(51) Int. Cl.
  *G11C 11/408* (2006.01)
  *G11C 11/409* (2006.01)
  *G11C 11/4074* (2006.01)

(52) U.S. Cl.
  CPC ........ *G11C 11/4087* (2013.01); *G11C 11/409* (2013.01); *G11C 11/4074* (2013.01); *G11C 11/4085* (2013.01)

(58) Field of Classification Search
  CPC .............. G11C 11/4087; G11C 11/409; G11C 11/4074; G11C 11/4085; G11C 16/30; G11C 16/08; G11C 16/0483
  See application file for complete search history.

(56) References Cited

U.S. PATENT DOCUMENTS

| 2012/0039130 A1* | 2/2012 | Yoon ....................... G11C 16/10 365/185.18 |
| 2016/0071599 A1* | 3/2016 | Hsu ......................... G11C 16/08 365/185.12 |
| 2019/0147959 A1* | 5/2019 | Hsu ...................... G11C 16/0483 365/185.12 |
| 2020/0152275 A1* | 5/2020 | Cho ........................ G11C 16/24 |

FOREIGN PATENT DOCUMENTS

| KR | 10-2016-0059174 | 5/2016 |
| KR | 10-2018-0085419 | 7/2018 |

* cited by examiner

Primary Examiner — Tri M Hoang
(74) Attorney, Agent, or Firm — IP & T Group LLP

(57) ABSTRACT

A memory device having improved read reliability includes: first blocks coupled to a first global line group and second blocks coupled to a second global line group; a voltage generator configured to generate an operating voltage for an operation performed on the first blocks and the second blocks; a block decoder configured to generate a block select signal for selecting a memory block on which a main operation is to be performed from among the first blocks as a selected block; and a block voltage controller configured to control the block decoder and the voltage generator to: perform a channel initializing operation of discharging channel regions of the selected block and a shared block which is selected from among the second blocks according to the block select signal; and perform a word line floating operation on the selected block and the shared block after the channel initializing operation.

20 Claims, 16 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2019-0029522, filed on Mar. 14, 2019, which is incorporated herein by reference in its entirety.

BACKGROUND

Field of Invention

The present disclosure generally relates to an electronic device, and more particularly, to a memory device and an operating method thereof.

Description of Related Art

A storage device stores data under the control of a host device such as a computer or a smart phone. The storage device may include a memory device for storing data and a memory controller for controlling the memory device. The memory device may be a volatile memory device or a nonvolatile memory device.

In a volatile memory device, data is stored only when power is supplied; stored data disappears when the supply of power is interrupted. The volatile memory device may be any of a Static Random Access Memory (SRAM), a Dynamic Random Access Memory (DRAM), and the like.

In a nonvolatile memory device, data does not disappear even when the supply of power is interrupted. The nonvolatile memory device may be any of a Read Only Memory (ROM), a Programmable ROM (PROM), an Electrically Programmable ROM (EPROM), an Electrically Erasable ROM (EEROM), a flash memory, and the like.

SUMMARY

Embodiments provide a memory device having improved read reliability and an operating method thereof.

In accordance with an aspect of the present disclosure, there is provided a memory device including: first blocks coupled to a first global line group and second blocks coupled to a second global line group; a voltage generator configured to generate an operating voltage for an operation performed on the first blocks and the second blocks; a block decoder configured to generate a block select signal for selecting a memory block on which a main operation is to be performed from among the first blocks as a selected block; and a block voltage controller configured to control the block decoder and the voltage generator to: perform a channel initializing operation of discharging channel regions of the selected block and a shared block which is selected from among the second blocks according to the block select signal; and perform a word line floating operation on the selected block and the shared block after the channel initializing operation, and wherein the word line floating operation floats word lines of the selected block and the shared block to a positive bias.

In accordance with another aspect of the present disclosure, there is provided a method for operating a memory device including a first block coupled to a first global line group through a first pass switch and a second block coupled to a second global line group through a second pass switch, the method comprising: performing a main operation on the first block; performing a channel initializing operation of discharging channel regions of the first block and the second block; and performing a word line floating operation of floating word lines of the first block and the second block to a positive bias after the channel initializing operation.

BRIEF DESCRIPTION OF THE DRAWINGS

Various embodiments are described more fully below with reference to the accompanying drawings.

DETAILED DESCRIPTION

Figure 1:
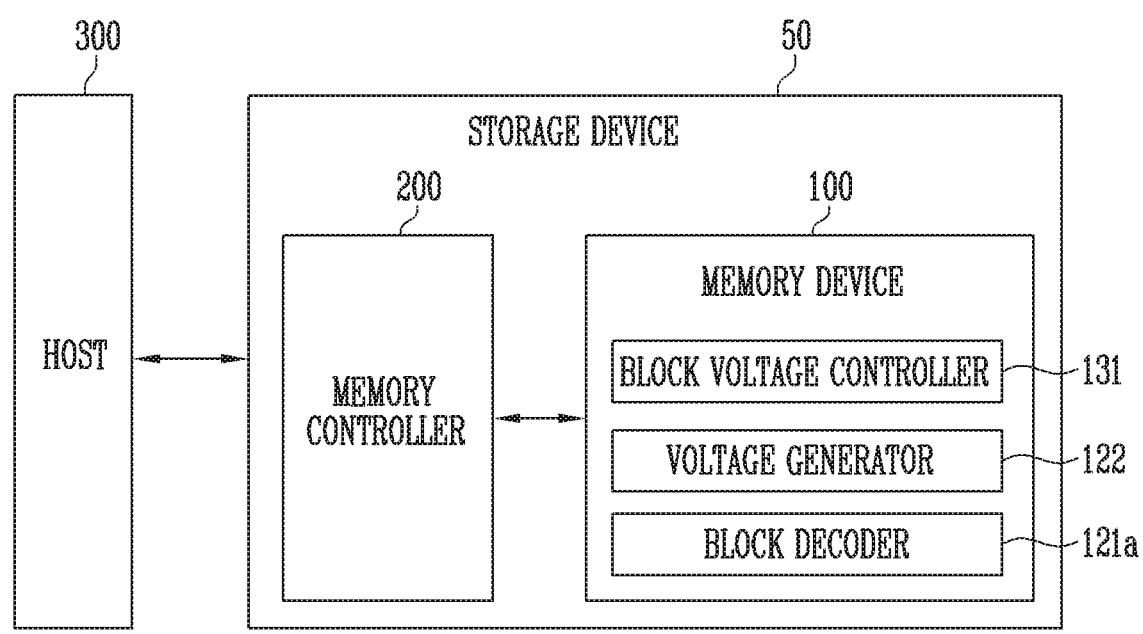
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 configured to control the memory device 100. The storage device 50 may store data under the control of a host 300, such as a mobile phone, a smart phone, an MP3 player, a laptop computer, a desktop computer, a game console, a TV, a tablet PC or an in-vehicle infotainment.

The storage device 50 may be configured as any of various types of storage devices according to a host interface that is a communication scheme with the host 300. For example, the storage device 50 may be implemented with any of a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any of various kinds of package types. For example, the storage device 50 may be manufactured as any of a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data.

Each of the memory cells may be configured as a single level cell (SLC) for storing one data bit, a multi-level cell (MLC) for storing two data bits, a triple level cell (TLC) for storing three data bits, or a quad level cell (QLC) for storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, by way of example, features and aspect of the present invention are described in the context in which the memory device 100 is a NAND flash memory.

The memory device 100 receives a command and an address from the memory controller 200 and accesses an area selected by the address in the memory cell array. That is, the memory device 100 may perform an operation corresponding to the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

In an embodiment, a global line group may include a global drain select line, global word lines, and a global source select line. A local line group may include a drain select line, word lines, and a source select line. The local line group may correspond to one memory block. The global line group may be coupled to local line groups of at least two memory blocks.

The global line group and the local line groups may be coupled to each other through pass switching circuits included in a pass switching group. For example, the global source select line may be coupled to source select lines included in the at least two local line groups through the pass switching circuits. The global drain select line may be coupled to drain select lines included in the at least two local line groups through the pass switching circuits. Each of the global word lines may be coupled to word lines at a corresponding position, which are included in the at least two local line groups, through the pass switching circuits.

A signal for controlling the pass switching circuits included in the pass switching group may be a block select signal. When an activated block select signal is applied to the pass switching group, the global line group and the local line groups, which are coupled to each other through the pass switching group, may be electrically coupled to each other. When an inactivated block select signal is applied to the pass switching group, the global line group and the local line groups, which are coupled to each other through the pass switching group, may be electrically isolated from each other.

An operating voltage applied to the global line group may be transferred to the local line group of each of the memory blocks coupled to the global line group through the pass switching group. For example, a voltage applied to the global source select line may be transferred to the source select lines of the at least two local line groups coupled to the global line group through the pass switching group. A voltage applied to the global drain select line may be transferred to the drain select lines of the at least two local line groups coupled to the global line group through the pass switching group. A voltage applied to each of the global word lines may be transferred to the word lines at the corresponding position, which are included in the at least two local line groups coupled to the global line group through the pass switching group.

In an embodiment, the memory device 100 may include a block decoder 121a, a voltage generator 122, and a block voltage controller 131.

The block decoder 121a may decode a block address representing a block position in an address received from the memory controller 200. The block decoder 121a may select at least one memory block among the plurality of memory blocks included in the memory cell array, based on the decoded block address.

In an embodiment, the block decoder 121a may generate a block select signal for selecting at least two memory blocks coupled to different global line groups among the plurality of memory blocks according to the decoded block address.

The block decoder 121a may apply an activated block select signal to a pass switching group that couples a local line group of a memory block to be selected to a global line group. When the activated block select signal is applied to the pass switching group, the local line group of the selected memory block and the global line group may be electrically coupled to each other. Thus, when an operating voltage is applied to the global line group, the operating voltage can be transferred to the local line group of the selected memory block through the pass switching group.

The block decoder 121a may apply an inactivated block select signal to a pass switching group that couples a local line group of a memory block to be unselected to a global line group. When the inactivated block select signal is applied to the pass switching group, the local line group of the unselected memory block and the global line group may be electrically isolated from each other. Thus, although an operating voltage is applied to the global line group, the operating voltage cannot be transferred to the local line group of the unselected memory block through the pass switching group.

The voltage generator 122 may generate voltages required in a main operation of the memory device 100. The main operation may be any one operation among a read operation, a program operation, and an erase operation. The voltage generator 122 may generate a voltage to be applied to global line groups under the control of the block voltage controller 131. The voltage generator 122 may apply the generated voltage to the global line groups under the control of the block voltage controller 131.

The block voltage controller 131 may control voltages respectively applied to word lines, a source select line, and a drain select line, which are included in a memory block, by controlling the block decoder 121a and the voltage generator 122. Specifically, the block voltage controller 131 may generate an operation control signal representing a position of a word line or select line to which a voltage is applied, a level of the applied voltage, and a timing at which the voltage is applied. The block voltage controller 131 may provide the generated operation control signal to the voltage generator 122.

In an embodiment, when a main operation on a selected memory block is completed, the block voltage controller 131 may control the block decoder 121a and the voltage generator 122 to perform a channel initializing operation of discharging channel regions of the selected memory block and a shared memory block. When the channel initializing operation is performed, a channel voltage of the selected memory block and the shared memory block is discharged to a ground voltage, and therefore, the number of holes trapped in each channel may be decreased.

In an embodiment, when the channel initializing operation is completed, the block voltage controller 131 may control the block decoder 121a and the voltage generator 122 to perform a word line floating operation on the selected memory block and the shared memory block. The word line floating operation floats word lines of the selected memory block and the shared memory block to a positive bias.

When the word line floating operation is performed, word lines of the selected memory block and the shared memory block may be floated to a positive voltage. When the word lines are floated to the positive voltage, a phenomenon in which holes are trapped in the channel due to an electrical repulsive force can be suppressed.

In an embodiment, a threshold voltage distribution memory cells may be shifted to the right by holes trapped in a channel of a memory block. When the threshold voltage distribution is shifted to the right, fail may occur when a read operation is performed using a default read voltage. Thus, the holes trapped in the channel of the memory block are removed, and holes are suppressed from being trapped in the channel, so that a phenomenon in which the read operation occurring when the threshold voltage distribution is shifted to the right has failed can be minimized.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data in the absence of a request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control the memory devices according to an interleaving scheme so as to improve operational performance. The interleaving scheme may be an operating scheme that allows operating periods of at least two memory devices 100 to overlap with each other.

The host 300 may communicate with the storage device 50, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and/or a Load Reduced DIMM (LRDIMM).

Figure 2:
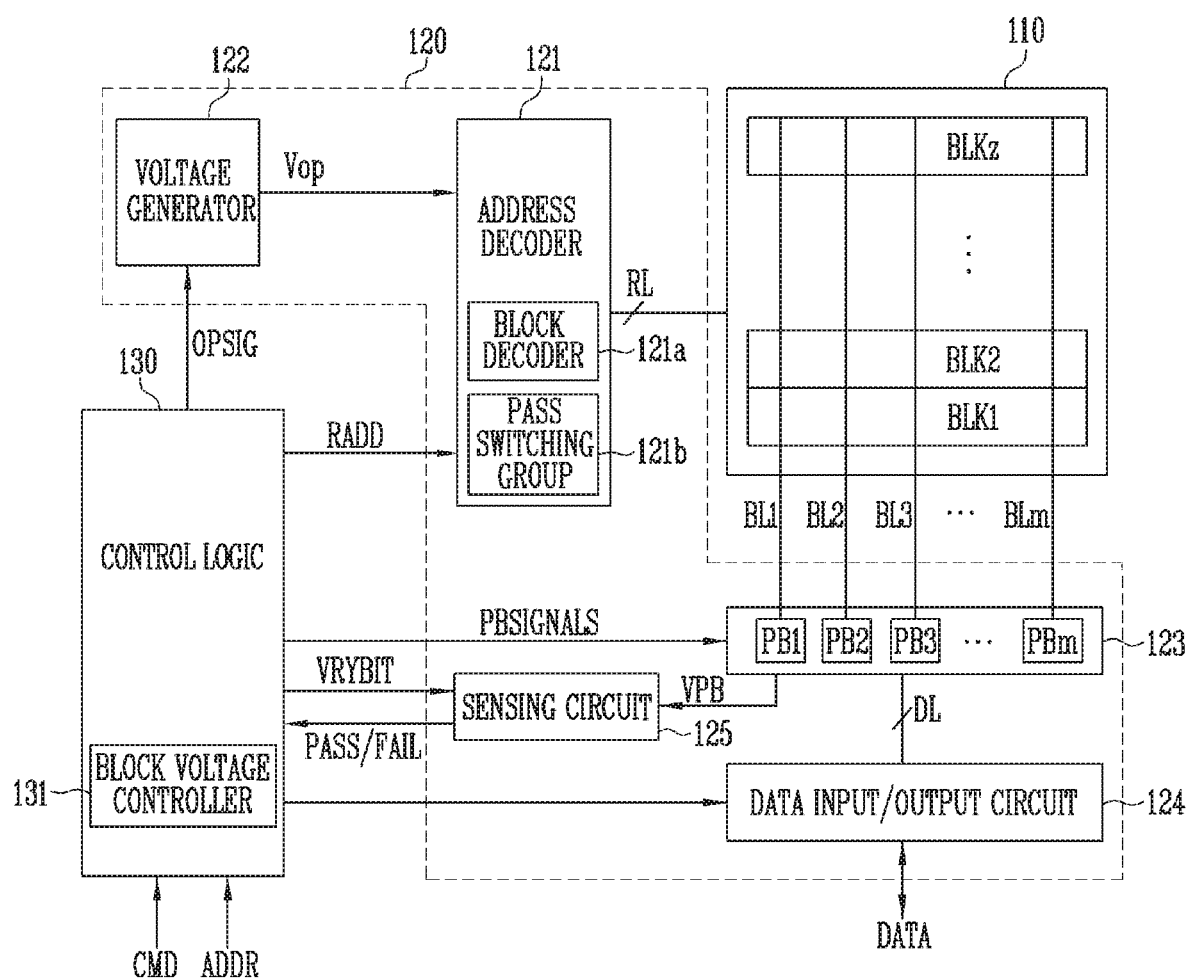
FIG. 2 is a diagram illustrating a structure of a memory device shown in FIG. 1.

FIG. 2 is a diagram illustrating a structure of the memory device shown in FIG. 1.

Referring to FIG. 2, the memory device 100 may include a memory cell array 100, a peripheral circuit 120, and control logic 130.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells.

In an embodiment, the plurality of memory cells may be nonvolatile memory cells. Memory cells coupled to the same word line among the plurality of memory cells may be defined as one physical page. That is, the memory cell array 110 may be configured with a plurality of physical pages. In accordance with an embodiment of the present disclosure, each of the plurality of memory blocks BLK1 to BLKz included in the memory cell array 110 may include a plurality of dummy cells. One or more dummy cells may be coupled in series between a drain select transistor and memory cells and between a source select transistor and the memory cells.

Each of the memory cells of the memory device may be configured as a single level cell (SLC) for storing one data bit, a multi-level cell (MLC) for storing two data bits, a triple level cell (TLC) for storing three data bits, or a quad level cell (QLC) for storing four data bits.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is coupled to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

In an embodiment, the row lines RL may be local lines included in local line groups. A local line group may correspond to one memory block. The local line group may include a drain select line, local word lines, and a source select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address RADD in the received address ADDR. The address decoder 121 may select at least one word line of the selected memory block by applying voltages provided from the voltage generator 122 to the word line WL according to the decoded row address RADD.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage applied to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select one memory block according to the decoded block address. In the erase operation, the address decoder 121 may apply a ground voltage to word lines coupled to the selected memory block.

In accordance with an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

In an embodiment, the address decoder 121 may include a block decoder 121a and a pass switching group 121b.

The block decoder 121a may be a row decoder. The block decoder 121a may select at least one memory block among the plurality of the memory cell array, based on a decoded block address.

In an embodiment, the block decoder 121a may generate a block select signal for selecting at least two memory blocks coupled to different global line groups among the plurality of memory blocks according to the decoded block address.

The block decoder 121a may apply an activated block select signal to the pass switching group 121b that couples a local line group of a memory block to be selected to a global line group. When the activated block select signal is applied to the pass switching group 121b, the local line group of the selected memory block and the global line group may be electrically coupled to each other. Thus, when an operating voltage Vop is applied to the global line group, the operating voltage Vop can be transferred to the local line group of the selected memory block through the pass switching group 121b.

The block decoder 121a may apply an inactivated block select signal to a pass switching group 121b that couples a local line group of a memory block to be unselected to a global line group. When the inactivated block select signal is applied to the pass switching group 121b, the local line group of the unselected memory block and the global line group may be electrically isolated from each other. Thus, although an operating voltage Vop is applied to the global line group, the operating voltage Vop cannot be transferred to the local line group of the unselected memory block through the pass switching group 121b.

The pass switching group 121b may include a plurality of pass switching circuits. The pass switching group 121b may be controlled according to the block select signal generated by the block decoder 121a.

For example, a global line group and local line groups may be coupled to each other through the pass switching circuits included in the pass switching group 121. For example, a global source select line may be coupled to source select lines included in at least two local line groups through the pass switching circuits. A global drain select line may be coupled to drain select lines included in the at least two local line groups through the pass switching circuits. Each of global word lines may be coupled to word lines at a corresponding position, which are included in the at least two local line groups, through the pass switching circuits.

A signal for controlling the pass switching circuits included in the pass switching group 121b may be a block select signal. When an activated block select signal is applied to the pass switching group 121b, the global line group and the local line groups, which are physically coupled to each other through the pass switching group 121b, may be electrically coupled to each other. When an inactivated block select signal is applied to the pass switching group 121b, the global line group and the local line groups, which are coupled to each other through the pass switching group 121b, may be electrically isolated from each other.

An operating voltage applied to the global line group may be transferred to a local line group of each of memory blocks coupled to the global line group through the pass switching group 121b. For example, a voltage applied to the global source select line may be transferred to the source select lines of the at least two local line groups coupled to the global line group through the pass switching group 121b. A voltage applied to the global drain select line may be transferred to the drain select lines of the at least two local line groups coupled to the global line group through the pass switching group 121b. A voltage applied to each of the global word lines may be transferred to the word lines at the corresponding position, which are included in the at least two local line groups coupled to the global line group through the pass switching group 121b.

The voltage generator 122 may generate a plurality of operating voltages Vop by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130.

The plurality of generated voltages Vop may be supplied to the memory cell array 110 by the address decoder 121.

In an embodiment, the voltage generator 122 may generate operating voltages Vop to be applied to global line groups under the control of a block voltage controller 131. The voltage generator 122 may apply the operating voltages Vop generated under the control of the block voltage controller 131 to the global line groups. The global line group may include a global source select line, global word lines, and a global drain select line.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate under the control of the control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The memory cells of the selected memory cells are programmed according to the transferred data DATA. A memory cell coupled to a bit line through which a program allow voltage (e.g., a ground voltage) is applied may have an increased threshold voltage. A threshold voltage of a memory cell coupled to a bit line through which a program inhibit voltage (e.g., a power voltage) is applied may be maintained. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to mth page buffers PB1 to PBm included in the read/write circuit 123.

In a read operation or verify operation, the sensing circuit 125 may generate a reference current in response to an allow bit VRYBIT signal generated by the control logic 130, and output a pass signal or fail signal to the control logic 130 by comparing a sensing voltage VPB received from the read/write circuit 123 and a reference voltage generated by the reference current.

The control logic 130 may be coupled to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

In an embodiment, the control logic 130 may include the block voltage controller 131. The block voltage controller 131 may control performance of a channel initializing operation on a channel region of a memory block. The block voltage controller 131 may control performance of a word line floating operation on word lines of a memory block.

The block voltage controller 131 may control voltages respectively applied to word lines, a source select line, and a drain select line, which are included in a memory block, by controlling the block decoder 121*a* and the voltage generator 122. Specifically, the block voltage controller 131 may generate an operation control signal representing a position of a word line or select line to which a voltage is applied, a level of the applied voltage, and a timing at which the voltage is applied. The block voltage controller 131 may provide the generated operation control signal to the voltage generator 122.

In an embodiment, when a main operation on a selected memory block is completed, the block voltage controller 131 may control the block decoder 121*a* and the voltage generator 122 to perform a channel initializing operation of discharging channel regions of the selected memory block and a shared memory block. The selected memory block may be selected according to the block select signal of the block decoder 121*a* among first blocks coupled to a first global line group. The shared memory block may be selected among second blocks coupled to a second global line group according to the same block select signal as the selected memory block.

During a channel initializing operation period, the block voltage controller 131 may control the block decoder 121*a* and the voltage generator 122 to apply a set voltage to each of the first global line group and the second global line group for a certain amount of time. The set voltage applied to the first global line group may be transferred to a local line group of the selected memory block. The set voltage applied to the second global line group may be transferred to a local line group of the shared memory block.

In an embodiment, when a channel initializing operation is completed, the block voltage controller 131 may control the block decoder 121*a* and the voltage generator 122 to perform a word line floating operation on the selected memory block and the shared memory block.

During a word line floating operation period, the block voltage controller 131 may control the block decoder 121*a* and the voltage generator 122 to discharge, to a ground voltage level, the level of the set voltage applied to the local line group of the selected memory block and the local line group of the shared memory block. In other words, the block voltage controller 131 may control the block decoder 121*a* and the voltage generator 122 to discharge a voltage level of the local line group of the selected memory block and the local line group of the shared memory block to the ground voltage level.

Specifically, the block voltage controller 131 may control, during the word line floating operation, the block decoder 121*a* and the voltage generator 122 to perform a first discharge operation of discharging, to the ground voltage level, the level of a voltage applied to global drain select lines and global source select lines, which are included in each of the first and second global line groups. When the first discharge operation is completed, a drain select line and a source select line of each of the selected memory block and the shared memory block may also be discharged to the ground voltage level.

When the first discharge operation is completed, the block voltage controller 131 may control, during the word line floating operation, the block decoder 121*a* to perform a second discharge operation of discharging a voltage level of the block select signal. When the voltage level of the block select signal is discharged, the block select signal may be inactivated. Therefore, since an inactivated block select signal is applied to a pass switching circuit that couples the first global line group to the local line group of the selected memory block, the first global line group and the local line group of the selected memory block may be electrically isolated from each other. Since an inactivated block select signal is applied to a pass switching circuit that couples the second global line group to the local line group of the shared memory block, the second global line group and the local line group of the shared memory block may be electrically isolated from each other.

When the second discharge operation is completed, the block voltage controller 131 may control, during the word line floating operation, the block decoder 121*a* and the voltage generator 122 to perform a third discharge operation of discharging, to the ground voltage level, the level of a voltage applied to global word lines included in each of the first and second global line groups.

The block voltage controller 131 may control, during the word line floating operation, the block decoder 121*a* and the voltage generator 122 to sequentially perform the first discharge operation, the second discharge operation, and the third discharge operation on the selected memory block and the shared memory block. In various embodiments, the third discharge operation may be simultaneously performed with the second discharge operation, or be performed after the second discharge operation is performed.

In an embodiment, the word line floating operation includes the first discharge operation and the second discharge operation. The word line floating operation further includes the third discharge operation.

In an embodiment, when the first discharge operation is performed, a source select transistor and a drain select transistor, which are included in each of the selected memory block and the shared memory block, may be turned off. Therefore, since a set voltage is continuously applied to word lines included in each of the selected memory block and the shared memory block up until the second discharge operation is performed, the potential of the word lines of each of the selected memory block and the shared memory block may be increased.

When the second discharge operation is performed, the first global line group and the word lines of the selected memory block may be electrically isolated from each other. When the second discharge operation is performed, the second global line group and the word lines of the shared memory block may be electrically isolated from each other. Therefore, the potential of the word lines of each of the selected memory block and the shared memory block may be floated to a positive voltage.

Figure 3:
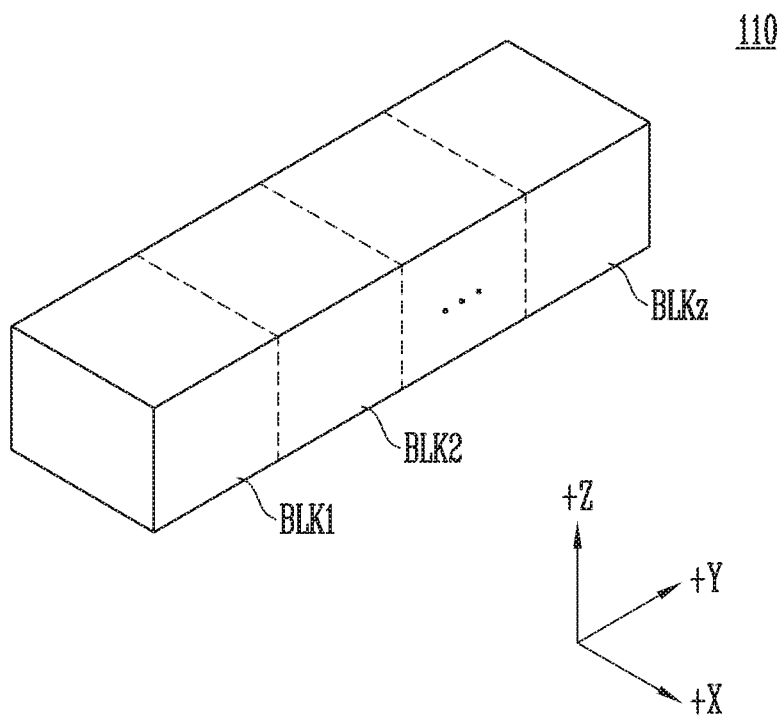
FIG. 3 is a diagram illustrating an embodiment of a memory cell array shown in FIG. 2.

FIG. 3 is a diagram illustrating an embodiment of the memory cell array shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block is described in more detail with reference to FIGS. 4 and 5.

Figure 4:
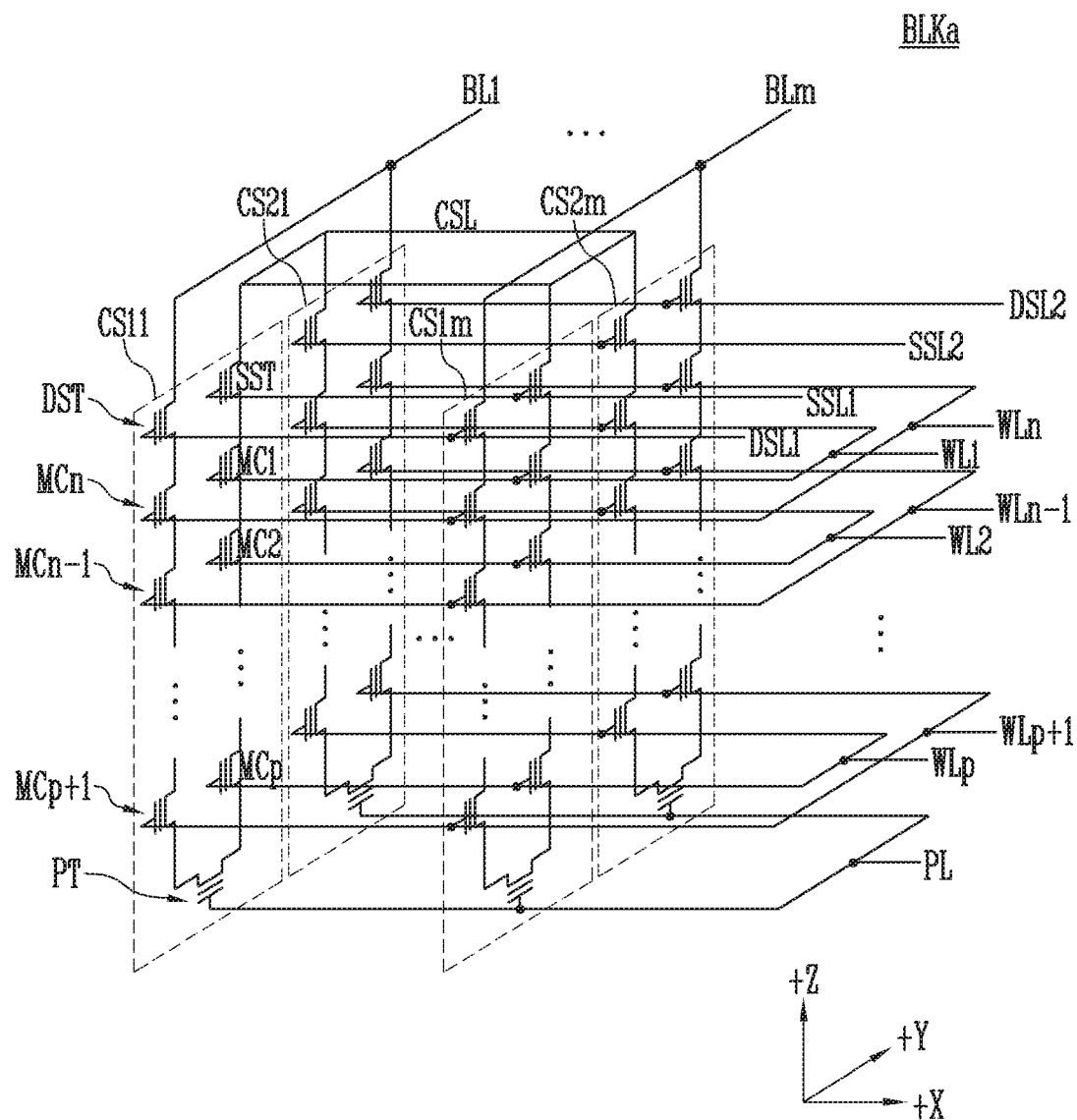
FIG. 4 is a circuit diagram illustrating any one memory block among memory blocks shown in FIG. 3.

FIG. 4 is a circuit diagram illustrating any one memory block BLKa among the memory blocks BLK1 to BLKz shown in FIG. 3.

Referring to FIG. 4, the memory block BLKa may include a plurality of cell strings CS11 to CS1*m* and CS21 to CS2*m*. In an embodiment, each of the plurality of cell strings CS11 to CS1*m* and CS21 to CS2*m* may be formed in a 'U' shape. In the memory block BLKa, m cell strings are arranged in a row direction (i.e., a +X direction). FIG. 4 illustrates two cell strings arranged in a column direction (i.e., a +Y direction). However, this is for clarity; it will be understood that three cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the dummy memory cell(s), each may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 5:
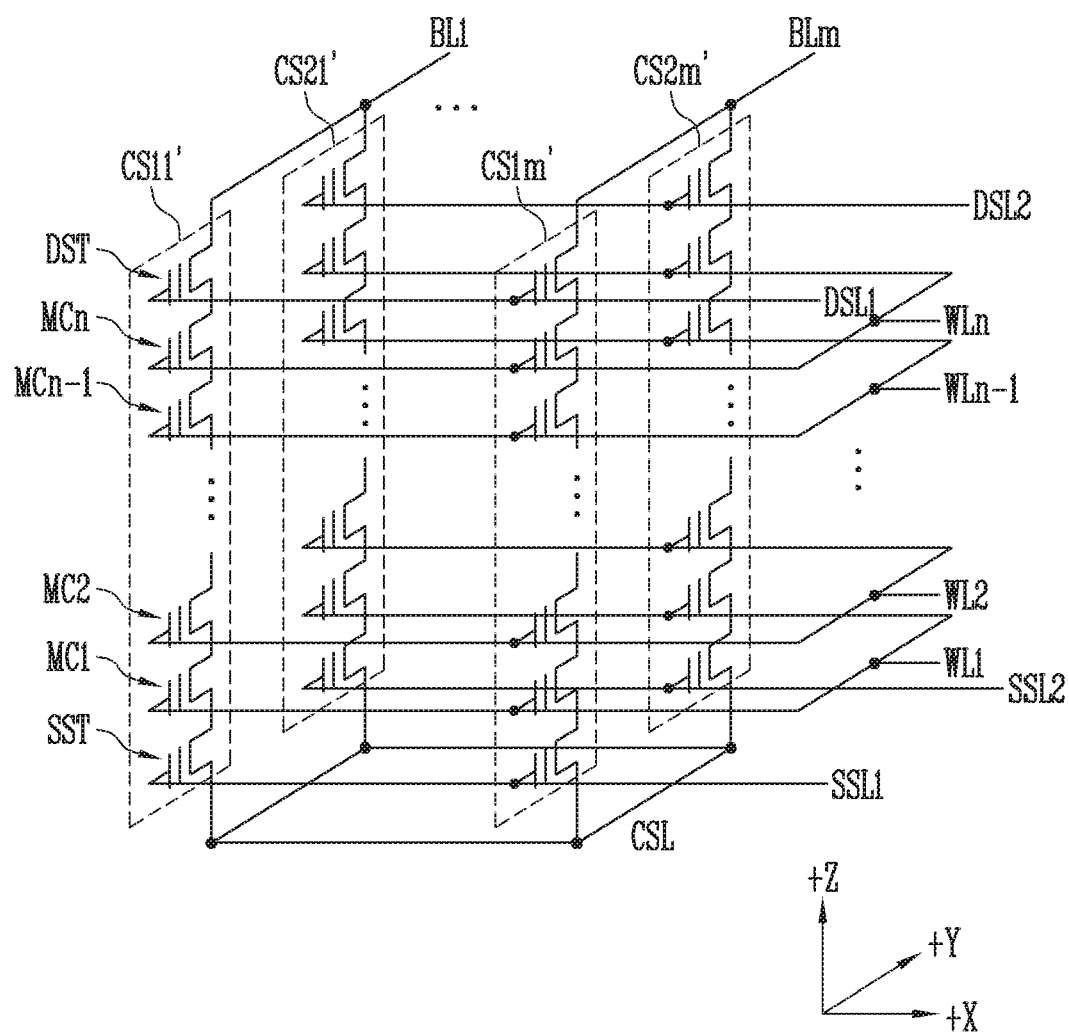
FIG. 5 is a circuit diagram illustrating another embodiment of any one memory block among the memory blocks shown in FIG. 3.

FIG. 5 is a circuit diagram illustrating another embodiment BLKb of the one memory block among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings C521' to CS2m' arranged on a second row are coupled to a second source select line SSL2.

In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the dummy memory cell(s), each may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 6:
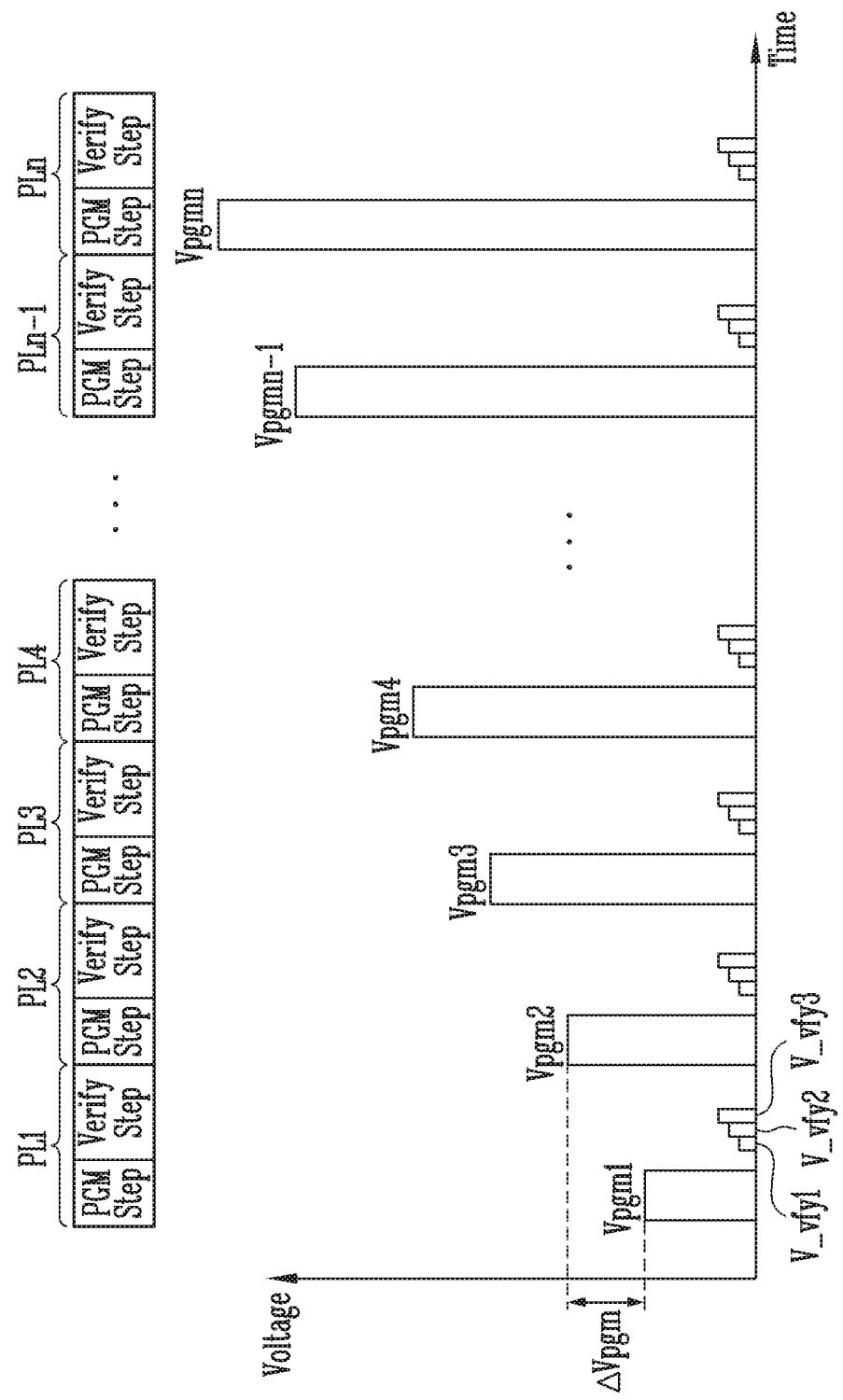
FIG. 6 is a diagram illustrating a program operation shown in FIG. 2.

FIG. 6 is a diagram illustrating the program operation shown in FIG. 2.

Referring to FIG. 6, the program operation may include a plurality of program loops PL1 to PLn. When each memory cell is an MLC for storing two data bits, the memory device described with reference to FIG. 1 may program selected memory cells to have any of three program states P1, P2, and P3 by performing the plurality of program loops PL1 to PLn. While such programming is described in the context of three-program-state MLCs, the present invention is not limited to that specific configuration. Principles explained below may be extended to higher-storage capacity memory cells, i.e., TLCs and QLCs, which have more program states.

Each of the plurality of program loops PL1 to PLn may include a program voltage apply step PGM Step of applying a program pulse and a verify step Verify Step of determining whether memory cells have been programmed by applying verify voltages.

For example, when a first program loop PL1 is performed, first to third verify voltages V_vfy1 to V_vfy3 are sequentially applied so as to verify a program state of a plurality of memory cells after a first program pulse Vpgm1 is applied. Memory cells having a target state that is a first program state P1 may be verified using the first verify voltage V_vfy1, memory cells having a target state that is a second program state P2 may be verified using the second verify voltage V_vfy2, and memory cells having a target state that is a third program state P3 may be verified using the third verify voltage V_vfy3.

Each of the memory cells that has passed has its target state, and may be program-inhibited in a subsequent second program loop PL2. In order to program the other memory cells, excluding the memory cells program-inhibited in the second program loop PL2, a second program pulse Vpgm2 higher by a unit voltage ΔVpgm than the first program pulse Vpgm1 may be applied to the other memory cells. Subsequently, a verify operation is performed identically to that of the first program loop PL1. In an example, the verify pass indicates that a memory cell is read as an off-cell by a corresponding verify voltage.

As described above, when the memory device programs an MLC for storing two data bits, the memory device verifies each of memory cells using the verify voltage V_vfy1 to V_vfy3 corresponding to the target state of that memory cell.

In the verify step, a verify voltage may be applied to a selected word line coupled to the selected memory cells, and a page buffer may determine whether the selected memory cells have passed verification based on a current or voltage flowing through bit lines respectively coupled to the selected memory cells.

Figure 7:
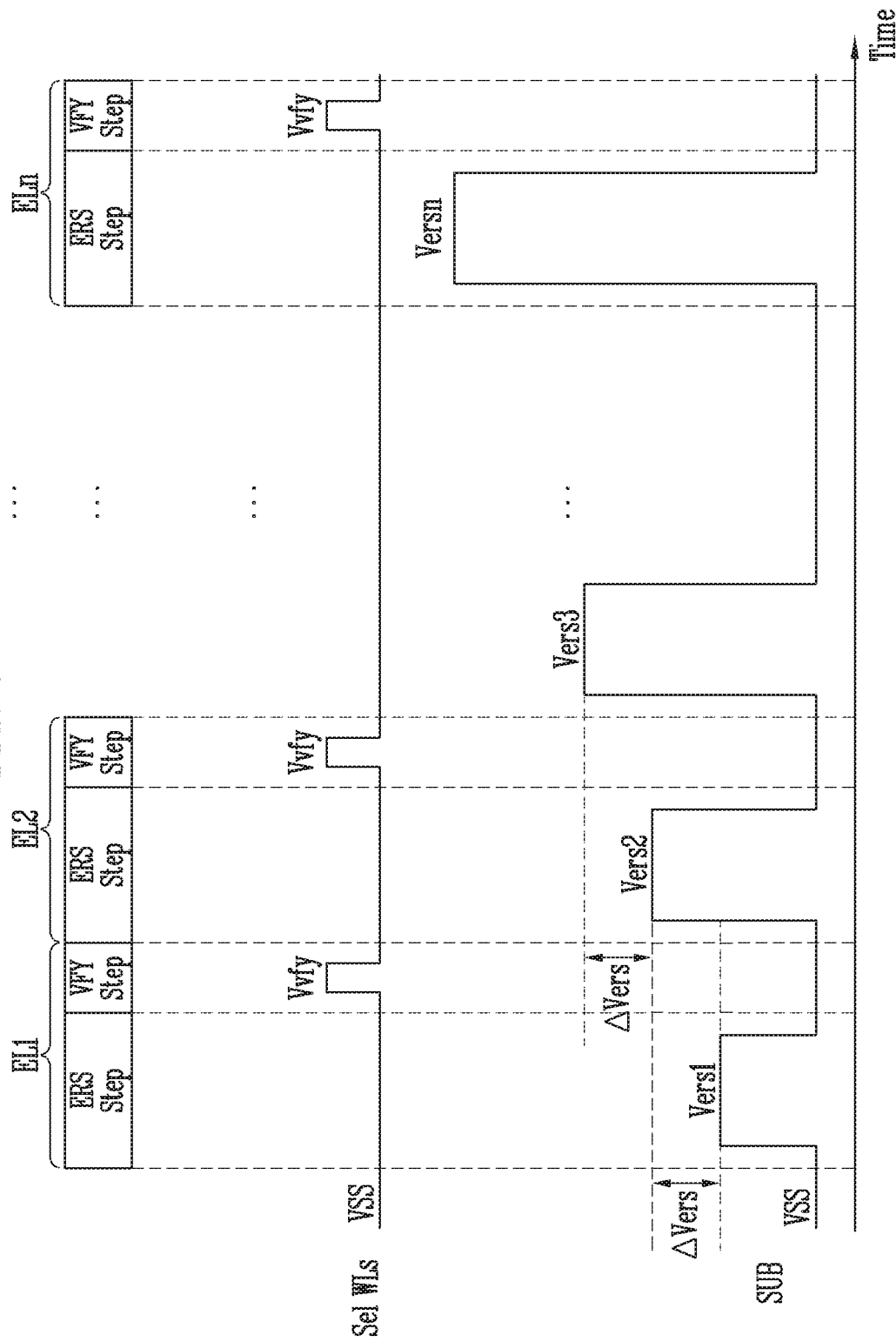
FIG. 7 is a diagram illustrating an erase operation shown in FIG. 2.

FIG. 7 is a diagram illustrating the erase operation shown in FIG. 2.

Referring to FIG. 7, the erase operation may include first to nth erase loops EL1 to ELn (n is a positive integer greater than 1). Each erase loop may include an erase step ERS Step and a verify step VFY Step.

In the erase step ERS step, an erase voltage Vers may be applied to a channel region of a plurality of memory strings included in a memory block. That is, the erase voltage Vers may be applied to a substrate SUB including the channel region. A ground voltage VSS may be applied to word lines coupled to the memory block while the erase voltage Vers is being applied.

In the verify step VFY Step, the memory device may determine whether memory cells included in the memory block have threshold voltages corresponding to an erase state. Specifically, in the verify step VFY Step, an erase verify voltage Vvfy may be applied to the word lines coupled to the memory block. The memory cells may be determined as on-cells or off-cells according to whether the threshold voltages of the memory cells are lower than the erase verify voltage Vvfy.

For example, when the threshold voltages of the memory cells are lower than the erase verify voltage Vvfy, the memory cells may be determined as on-cells. When the threshold voltages of the memory cells are higher than or equal to the erase verify voltage Vvfy, the memory cells may be determined as off-cells. In the verify step VFY step, when the number of memory cells having threshold voltages lower than the erase verify voltage Vvfy exceeds a set number, the erase operation may pass. When the number of memory cells having threshold voltages lower than the erase verify voltage Vvfy is equal to or smaller than the threshold number, the erase operation may fail. An erase loop EL may be repeated. The threshold number may be predetermined.

Whenever the erase loop EL is repeated, the level of the immediately previous erase voltage Vers may be increased by a step voltage ΔVers (Incremental Step Pulse Erase (ISPE)) for the next erase loop EL. The level of an erase voltage Vers2 of the second erase loop EL2 may be further increased by the step voltage ΔVers relative to erase voltage Vers1 of the first erase loop EL1. The level of an erase voltage Vers3 of the third erase loop EL3 may be further increased by the step voltage ΔVers relative to erase voltage Vers2 of the second erase loop EL2. In this manner, the level of an erase voltage Versn of the nth erase loop ELn may be further increased by the step voltage ΔVers relative to erase voltage Vers(n−1) of the (n−1)th erase loop EL(n−1).

In an embodiment, in an erase step ERS Step of the first erase loop EL1, the erase voltage Vers1 may be applied to a channel region of a plurality of memory cell strings included in a memory block. That is, the erase voltage Vers1 may be applied to a substrate SUB including the channel region. The ground voltage VSS may be applied to the word lines coupled to the memory block while the erase voltage Vers1 is being applied. When the erase step ERS Step ends, a verify step VFY Step of the first erase loop EL1 may be performed.

In the verify step VFY Step of the first erase loop EL1, the erase verify voltage Vvfy may be applied to the word lines coupled to the memory block. When the erase operation passes in the verify step VFY Step, the erase operation may end. When the erase operation fails in the verify step VFY Step, the second erase loop EL2 may be performed. The second erase loop EL2 may also be performed in the same manner as the first erase loop ELL The second to nth erase loops EL2 to ELn may be performed until the erase operation passes.

Figure 8:
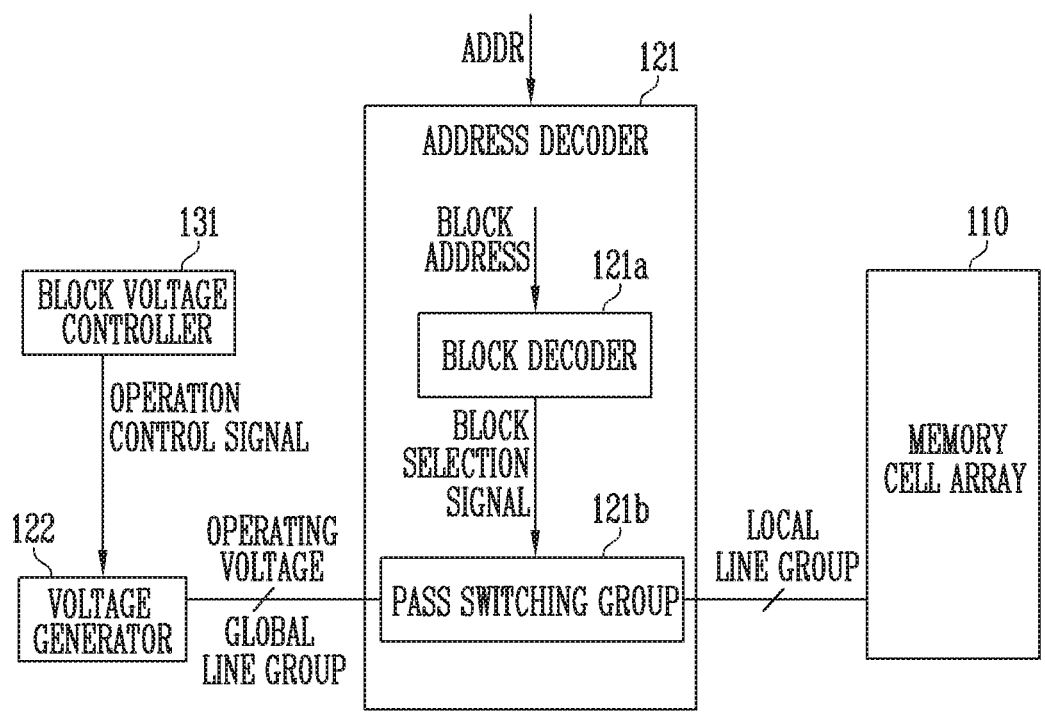
FIG. 8 is a diagram illustrating a configuration and an operation of the memory device in accordance with an embodiment of the present disclosure.

FIG. 8 is a diagram illustrating a configuration and an operation of the memory device in accordance with an embodiment of the present disclosure.

Referring to FIGS. 2 and 8, a block voltage controller 131 may generate an operation control signal and apply the operation control signal to a voltage generator 122. The block voltage controller 131 may control a level of an operating voltage, a time for which the operating voltage is applied, and a position at which the operating voltage is applied through the operation control signal.

The voltage generator 122 may be coupled to a pass switching group 121b through a global line group. The voltage generator 122 may generate an operating voltage to be applied to global lines included in the global line group in response to the operation control signal. The global line group may include a global source select line, global word lines, and a global drain select line.

An address decoder 121 may include a block decoder 121a and the pass switching group 121b.

The address decoder 121 may decode a row address RADD in a received address ADDR. The address decoder 121 may select at least one word line of a selected memory block by applying voltages provided from the voltage generator 122 to at least one word line WL according to the decoded row address RADD.

The block decoder 121a may decode a block address in the received address ADDR. The block decoder 121a may select at least one memory block among memory blocks BLK1 to BLKz according to the decoded block address. The block decoder 121a may generate a block select signal for selecting at least one memory block. The block decoder 121a may provide the generated block select signal to the pass switching group 121B.

The pass switching group 121b may include a plurality of pass switching circuits. The pass switching circuits may couple a global line group to local line groups. Each of the pass switching circuits may be controlled according to a block select signal. For example, when an activated block select signal is applied to the pass switching circuit, the pass switching circuit may be turned on. When an inactivated block select signal is applied to the pass switching circuit, the pass switching circuit may be turned off.

That is, global lines included in the global line group and local lines included in the local line groups may be electrically coupled to or electrically isolated from each other.

A memory cell array 110 may include a plurality of memory blocks. One memory block may correspond to one local line group. The local line group of the memory block may include a source select line, local word lines, and a drain select line.

In an embodiment, one global line group may be coupled at least two local line groups through the pass switching circuits included in the pass switching group 121b. A detailed structure is described below with reference to FIG. 9.

Figure 9:
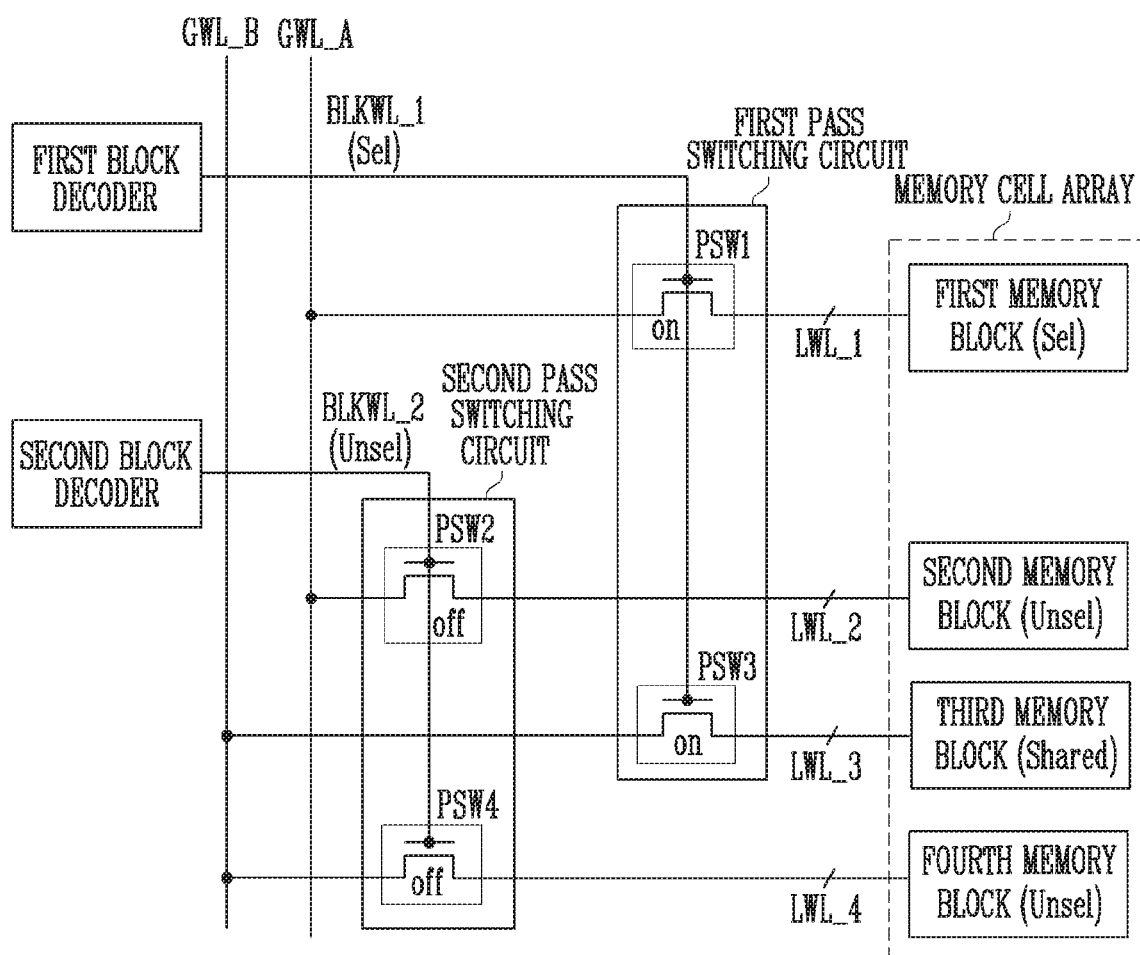
FIG. 9 is a diagram illustrating a selected memory block and a shared memory block in accordance with an embodiment of the present disclosure.

FIG. 9 is a diagram illustrating a selected memory block and a shared memory block in accordance with an embodiment of the present disclosure.

Referring to FIG. 9, a memory cell array may include first to fourth memory blocks.

The first memory block may be coupled to a first block decoder through a first pass switch PSW1. The second memory block may be coupled to a second block decoder through a second pass switch PSW2. The third memory block may be coupled to the first block decoder through a third pass switch PSW3. The fourth memory block may be coupled to the second block decoder through a fourth pass switch PSW4.

Therefore, the first memory block and the third memory block may be commonly coupled to the first block decoder through a first pass switching circuit. The first pass switching circuit may include the first pass switch PSW1 and the third pass switch PSW3. The first pass switch PSW1 and the third pass switch PSW3 may be controlled according to a first block select signal BLKWL_1 generated by the first block decoder.

The second memory block and the fourth memory block may be commonly coupled to the second block decoder through a second pass switching circuit. The second pass switching circuit may include the second pass switch PSW2 and the fourth pass switch PSW4. The second pass switch PSW2 and the fourth pass switch PSW4 may be controlled according to a second block select signal BLKWL_2 generated by the second block decoder.

First global word lines GWL_A included in a first global word line group may be coupled to word lines LWL_1 included in a local line group of the first memory block through the first pass switch PSW1. The first global word lines GWL_A may be coupled to word lines LWL_2 included in a local line group of the second memory block through the second pass switch PSW2. Second global word lines GWL_B included in a second global word line group may be coupled to word lines LWL_3 included in a local line group of the third memory block through the third pass switch PSW3. The second global word lines GWL_B may be coupled to word lines LWL_4 included in a local line group of the fourth memory block through the fourth pass switch PSW4.

The first memory block and the third memory block may share a block word line coupled to the first pass switch PSW1 the third pass switch PSW3. The second memory block and the fourth memory block may share a block word line coupled to the second pass switch PSW2 and the fourth pass switch PSW4. As exemplified in FIG. 9, gates of the first and third pass switches PSW1 and PSW3 may be commonly coupled to the block word line. The first block select signal BLKWL_1 from the first block decoder may be applied to the gates of the first and third pass switches PSW1 and PSW3 through the block word line.

Specifically, a connection between the first global word lines GWL_A and the word lines LWL_1 is controlled by the first block select signal BLKWL_1 applied to the gate of the first pass switch PSW1. A connection between the second global word lines GWL_B and the word lines LWL_3 is controlled by the first block select signal BLKWL_1 applied to the gate of the third pass switch PSW3.

In an embodiment, an operating voltage is applied to the first global word lines GWL_A, and may not be applied to the second global word lines GWL_B. The first block decoder may generate an activated first block select signal BLKWL_1. Therefore, the first memory block and the third memory block, which are commonly coupled to the first block decoder, may be selected. The second block decoder may generate an inactivated second block select signal BLKWL_2. Therefore, the second memory block and the fourth memory block, which are commonly coupled to the second block decoder, may be unselected.

In an embodiment, the first memory block may be a selected memory block. The third memory block may be a shared memory block. The second and fourth memory blocks may be unselected memory blocks.

Specifically, the selected first memory block may be coupled to the first global word lines GWL_A to which the operating voltage is applied between the first memory block and the third memory block, which are selected according to the activated first block select signal BLKWL_1. The shared third memory block may be coupled to the second global word lines GWL_B to which the operating voltage is not applied between the first memory block and the third memory block, which are selected according to the activated first block select signal BLKWL_1. The unselected second and fourth memory blocks are not selected according to the inactivated second block select signal BLKWL_2.

In various embodiments, global source select lines and global drain select lines, which are included in the first and second global line groups, may also be coupled a source select line and a drain select line of a local line group of each memory block in the same manner as described above.

The present invention is not limited to the specific details described above including number of memory blocks, number of block decoders, and number of pass switching groups.

Figure 10:
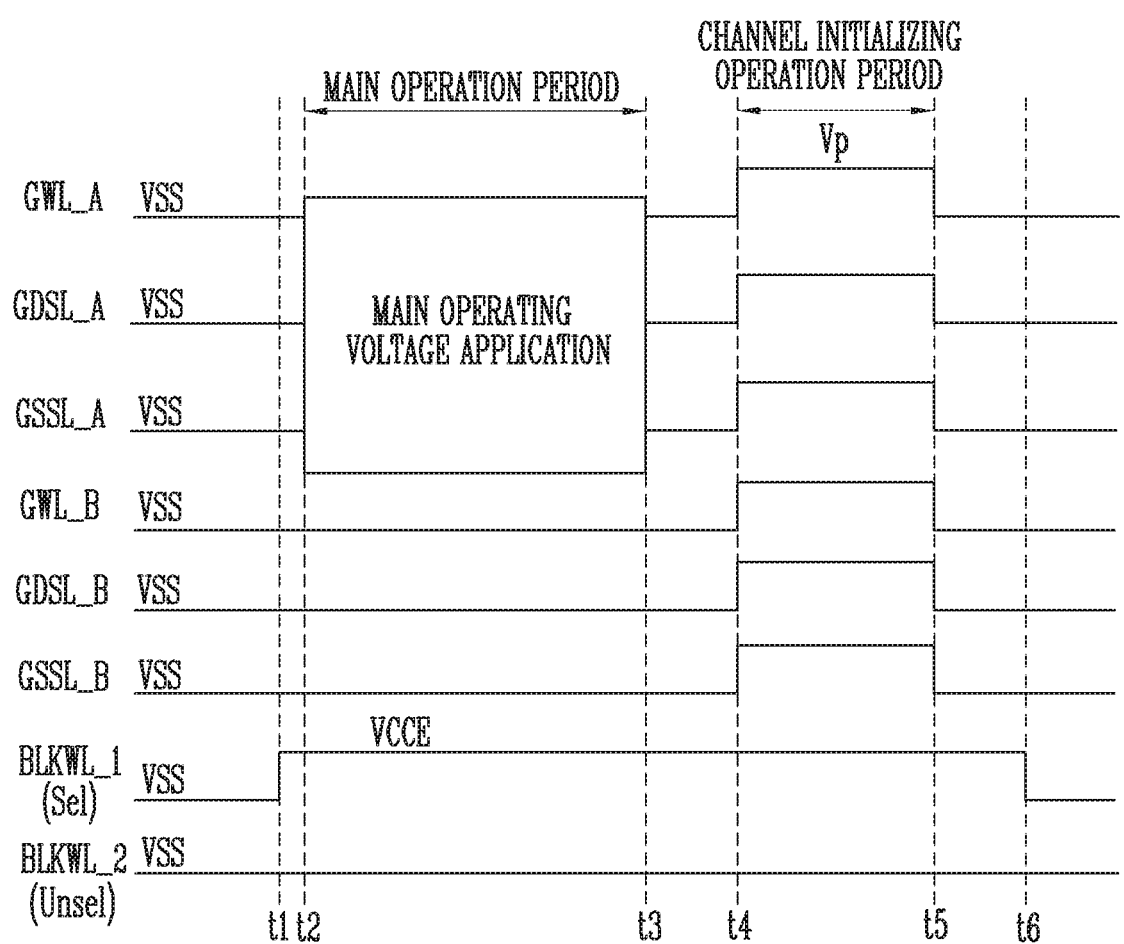
FIG. 10 is a waveform diagram illustrating an operating method of the memory device in accordance with an embodiment of the present disclosure.

FIG. 10 is a waveform diagram illustrating an operating method of the memory device in accordance with an embodiment of the present disclosure.

Referring to FIGS. 9 and 10, the first global line group may include a first global source select line GSSL_A, the first global word lines GWL_A, and a first global drain select line GDSL_A. The second global line group may include a second global source select line GSSL_B, the second global word lines GWL_B, and a second global drain select line GDSL_B.

The local line group of the first memory block, as the selected memory block, may be coupled to the first global line group according to the first block select signal BLKWL_1. The local line group of the third memory block, as the shared memory block, may be coupled to the second global line group according to the first block select signal BLKWL_1.

The local line group of the second memory block, as an unselected memory block, may be coupled to the first global line group according to the second block select signal BLKWL_2. The local line group of the fourth memory block, as an unselected memory block, may be coupled to the second global line group according to the second block select signal BLKWL_2.

In accordance with an embodiment of the present disclosure, at time t1, the first block select signal BLKWL_1 may be activated. When the first block select signal BLKWL_1 is activated, the voltage level of the first block select signal BLKWL_1 may be changed from a low level to a high level. In another embodiment, when the first block select signal BLKWL_1 is activated, the voltage level of the first block select signal BLKWL_1 may be changed from the high level to the low level.

The low level may be a level of a ground voltage VSS. The high level may be a level of a power voltage VCCE.

A period from t2 to t3 may be a main operation period. Operating voltages required in a main operation performed on the selected memory block may be applied to the first global line group. The main operation may be a read operation, a program operation, or an erase operation.

The shared memory block may experience stress caused by the main operation performed on the selected memory block through a commonly coupled block word line according to the activated first block select signal BLKWL_1. Holes may be trapped in a channel region of the shared memory block due to the stress caused by the main operation performed on the selected memory block.

The main operation may be completed at time t3, and a channel initializing operation may be performed at time t4 after a certain time elapses from time t3. The channel initializing operation may be an operation of removing holes trapped in a channel region by discharging the channel potential of a memory block to a ground voltage level.

A period from t4 to t5 may be a channel initializing operation period. A set voltage may be applied to the first global line group and the second global line group. The set voltage may be a dummy pulse voltage. The set voltage may be a positive voltage Vp, i.e., greater than 0 V.

A set voltage may be applied to a source select line, local word lines, and a drain select line, which are included in each of the local line group of the selected memory block and the local line group of the shared memory block. The set voltage may be equal to or greater than a minimum voltage for turning on a transistor coupled to each line.

Therefore, a source select transistor coupled to the source select line, transistors coupled to the word lines, and a drain select transistor coupled to the drain select line may all be turned on. A channel potential of each of the selected memory block and the shared memory block may be discharged to the ground voltage level. When each channel potential is discharged, the number of holes trapped in a channel region of the memory block may be decreased.

At time t5, when the channel initializing operation is completed, the first global line group and the second global line group may be discharged by applying the ground voltage to the first global line group and the second global line group.

At time t6, the first block select signal BLKWL_1 may be inactivated. When the first block select signal BLKWL_1 is inactivated, the voltage level of the first block select signal BLKWL_1 may be changed from the high level to the low level.

Figure 11:
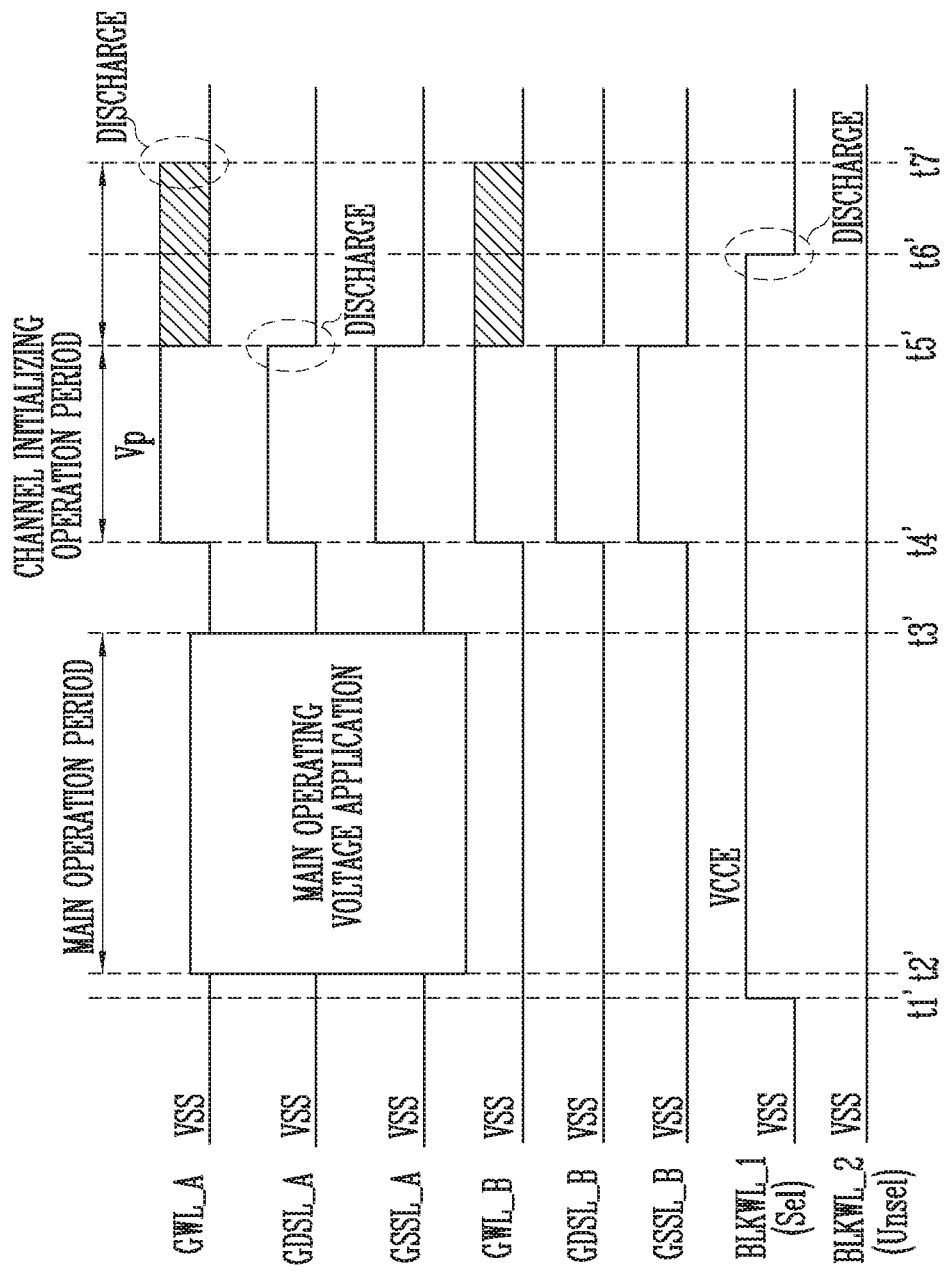
FIG. 11 is a waveform diagram illustrating an operating method of the memory device in accordance with another embodiment of the present disclosure.

FIG. 11 is a waveform diagram illustrating an operating method of the memory device in accordance with another embodiment of the present disclosure.

Referring to FIG. 11, when the channel initializing operation described with reference to FIG. 10 is completed, a word line floating operation may be performed. An operation in a period from t1' to t4' may be performed identically to that in the period from t1 to t4.

At time t5', the first global drain select line GDSL_A, the first global source select line GSSL_A, the second global drain select line GDSL_B, and the second global source select line GSSL_B may be discharged. Therefore, both the source select transistor coupled to the source select line and the drain select transistor coupled to the drain select line may be turned off.

The first global word lines GWL_A and the second global word lines GWL_B may maintain the set voltage applied in the channel initializing operation. Therefore, transistors of memory cells coupled to the word lines may all be turned on.

In other words, the source select transistor and the drain select transistor, which are included in each of the selected memory block and the shared memory block, are turned off, but a set voltage is continuously applied during a period from t5' to t6'. Therefore, potentials of the word lines may be increased.

At time t6', the first block select signal BLKWL_1 may be inactivated. When the first block select signal BLKWL_1 is inactivated, the voltage level of the first block select signal BLKWL_1 may be changed from the high level to the low level.

Therefore, the first global line group and the local line group of the selected memory block may be electrically isolated from each other. The second global line group and the local line group of the shared memory block may be electrically isolated from each other.

The set voltage applied to the word lines of the selected memory block is not discharged but may be floated. The set voltage applied to the word lines of the shared memory block is not discharged but may be floated.

At time t7', the first global word lines GWL_A and the second global word lines GWL_B may be discharged. In various embodiments, the time at which the first global word lines GWL_A and the second global word lines GWL_B are discharged may be the same as or later than the time at which the first block select signal BLKWL_1 is inactivated.

In another embodiment, the channel initializing operation of removing holes trapped in the channel regions of the shared memory block and the selected memory block by applying a dummy pulse and the word line floating operation of preventing holes from being trapped in the channel regions by floating the word lines of the shared memory block and the selected memory block to a positive voltage may be performed together. Thus, in accordance with the embodiment shown in FIG. 11, the threshold voltage distribution of memory cells is further moved to the right compared to a normal distribution, so that a phenomenon in which a read operation fails can be minimized more efficiently than that in the embodiment shown in FIG. 10.

Figure 12:
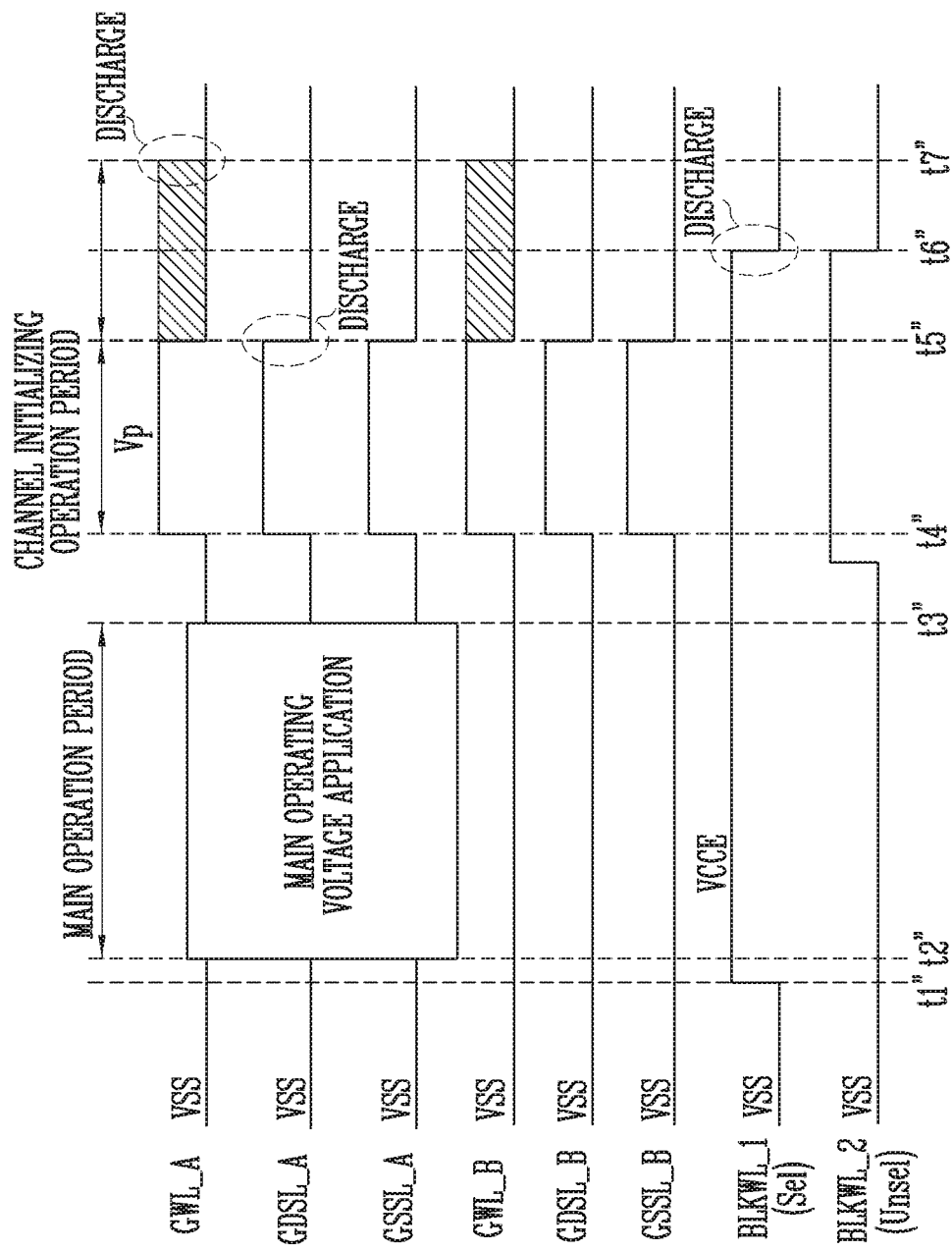
FIG. 12 is a waveform diagram illustrating an operating method of the memory device in accordance with another embodiment of the present disclosure.

FIG. 12 is a waveform diagram illustrating an operating method of the memory device in accordance with another embodiment of the present disclosure.

Referring to FIG. 12, the channel initializing operation and the word line floating operation, which are described with reference to FIG. 11, may be performed.

However, the second block select signal BLKWL_2 is activated during a period from t4" to t6", so that an effect according to the channel initializing operation and the word line floating operation can be applied even to an unselected memory block. The channel initializing operation and the word line floating operation are performed even on the unselected memory blocks in addition to the shared memory block, so that a phenomenon in which a read operation fails can be minimized more efficiently than that in the embodiment shown in FIG. 11.

Figure 13:
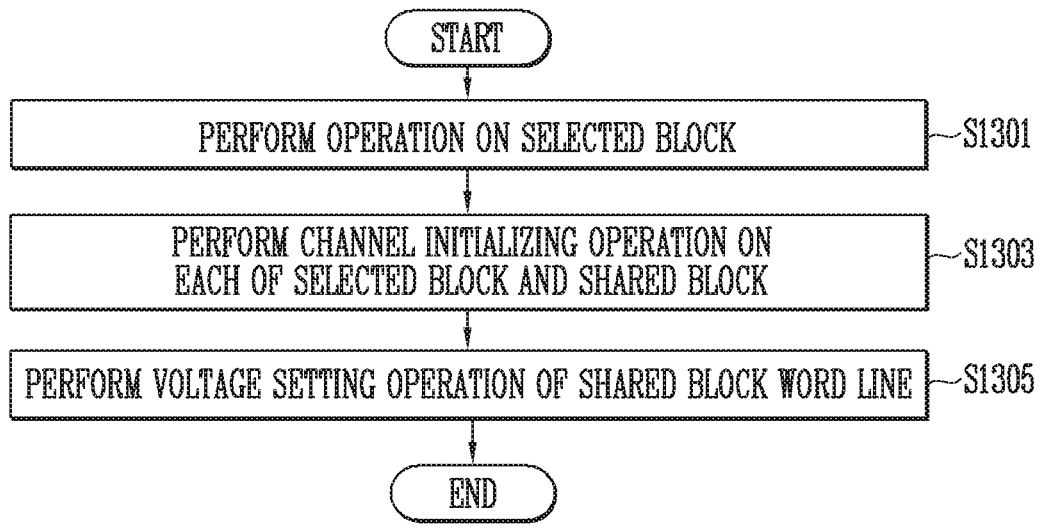
FIG. 13 is a flowchart illustrating an operation of the memory device in accordance with an embodiment of the present disclosure.

FIG. 13 is a flowchart illustrating an operation of the memory device in accordance with an embodiment of the present disclosure.

Referring to FIG. 13, in step S1301, the memory device may perform a main operation on a selected block.

In step S1303, the memory device may perform a channel initializing operation on each of the selected block and a shared block.

In step S1305, the memory device may perform a voltage setting operation on each of the selected block and the shared block. Specifically, the memory device may set a voltage of word lines included in each of the selected block and the shared block to a set voltage, which may be a positive voltage. The word lines included in each of the selected block and the shared block may be floating with the positive voltage through operations described in step S1403 to S1409.

Figure 14:
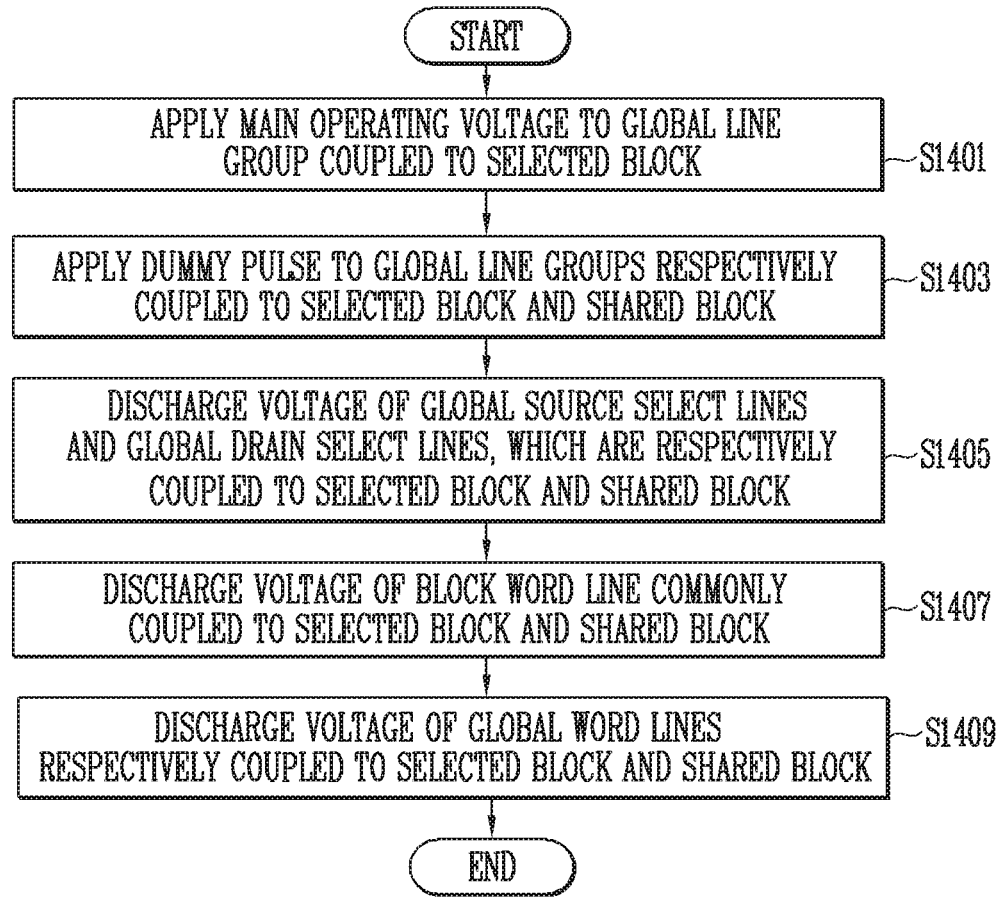
FIG. 14 is a flowchart illustrating an operation of the memory device in accordance with an embodiment of the present disclosure.

FIG. 14 is a flowchart illustrating an operation of the memory device in accordance with an embodiment of the present disclosure.

Referring to FIG. 14, in step S1401, the memory device may apply a main operating voltage to a global line group coupled to a selected block. The selected block may be a block on which a main operation is performed. The main operation may be any one operation among a read operation, a program operation, and an erase operation.

In step S1403, the memory device may apply a dummy pulse to global line groups respectively coupled to the selected block and a shared block. The level of the dummy pulse may be a positive voltage.

In step S1405, the memory device may discharge a voltage of global source select lines and global drain select lines, which are respectively coupled to the selected block and the shared block.

In step S1407, the memory device may discharge a voltage of a block word line commonly coupled to the selected block and the shared block. Specifically, a voltage level of a block select signal applied to the block word line may be discharged.

In step S1409, the memory device may discharge a voltage of global word lines respectively coupled to the selected block and the shared block.

Figure 15:
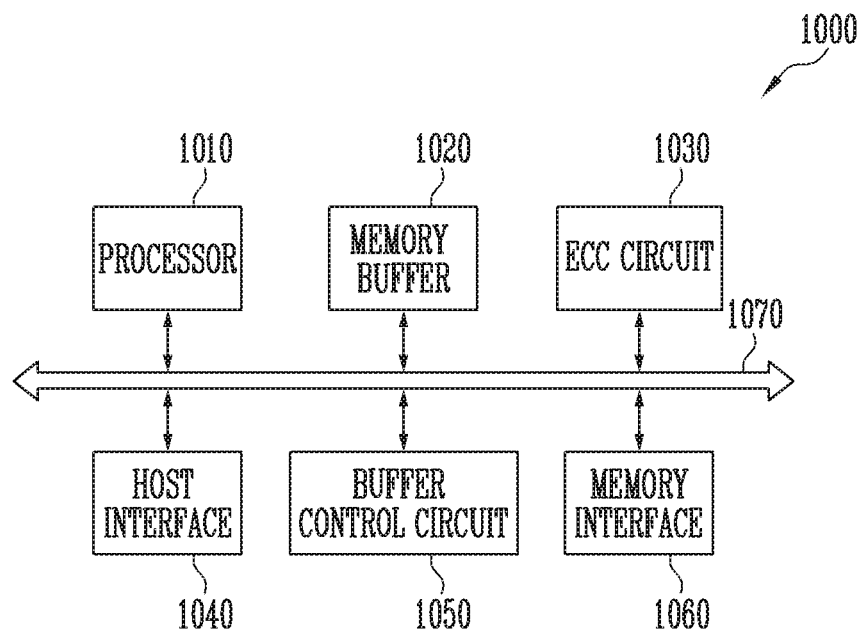
FIG. 15 is a diagram illustrating another embodiment of the memory controller shown in FIG. 1.

FIG. 15 is a diagram illustrating another embodiment of the memory controller shown in FIG. 1.

Referring to FIG. 15, a memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and/or a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050. Instead, either or both of the memory buffer 1020 and the buffer control circuit 1050 may be provided separately, or the functions of one or both may be distributed to other components within the memory controller 1000.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated so as not to interfere with, or influence, each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 16:
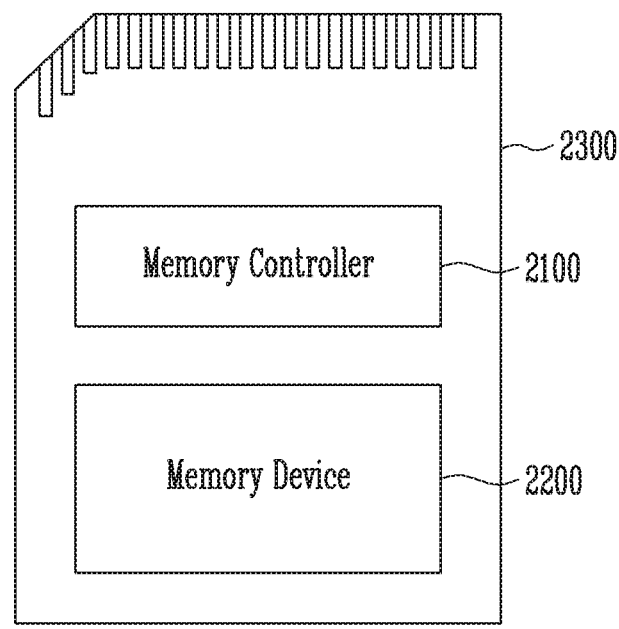
FIG. 16 is a block diagram illustrating a memory card system to which the storage device is applied in accordance with an embodiment of the present disclosure.

FIG. 16 is a block diagram illustrating a memory card system to which the storage device is applied in accordance with an embodiment of the present disclosure.

Referring to FIG. 16, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory controller 2100 may be implemented identically to the memory controller 200 described with reference to FIG. 1.

In an example, the memory controller 2100 may include components such as a Random Access Memory (RAM), a processor, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols, such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Hash Storage (UFS), Wi-Fi, Bluetooth, and/or NVMe.

In an example, the memory device 2200 may be implemented with any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device to constitute a memory card. For example, the memory controller 2100 and the memory device 2200 may be so integrated to constitute a memory card, such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and/or a Universal Flash Storage (UFS).

Figure 17:
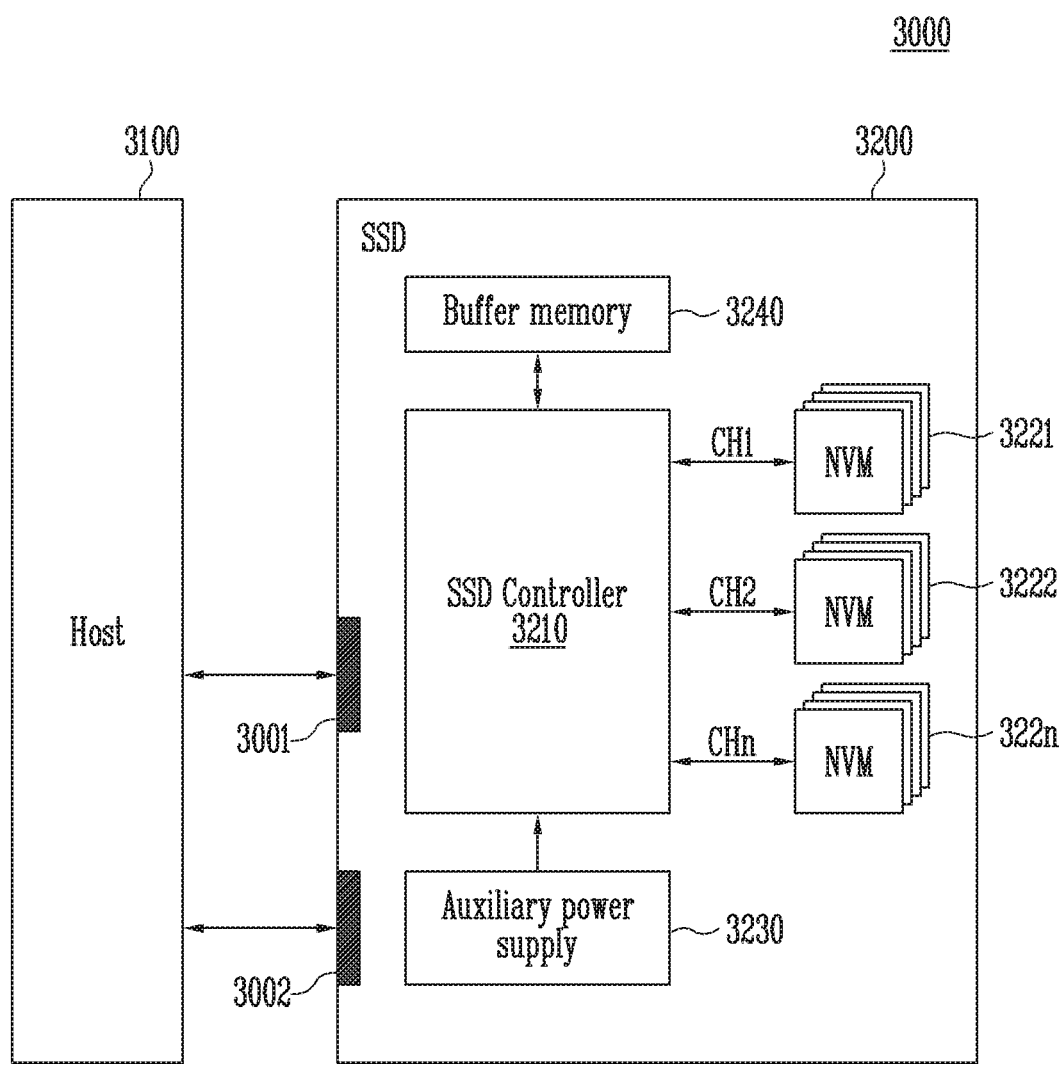
FIG. 17 is a block diagram illustrating a Solid State Drive (SSD) system to which the storage device is applied in accordance with an embodiment of the present disclosure.

FIG. 17 is a block diagram illustrating a Solid State Drive (SSD) system to which the storage device is applied in accordance with an embodiment of the present disclosure.

Referring to FIG. 17, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be based on an interface between the host 3100 and the SSD 3200. For example, the signal SIG may be defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or in another example be located externally to the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include any of various volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 18:
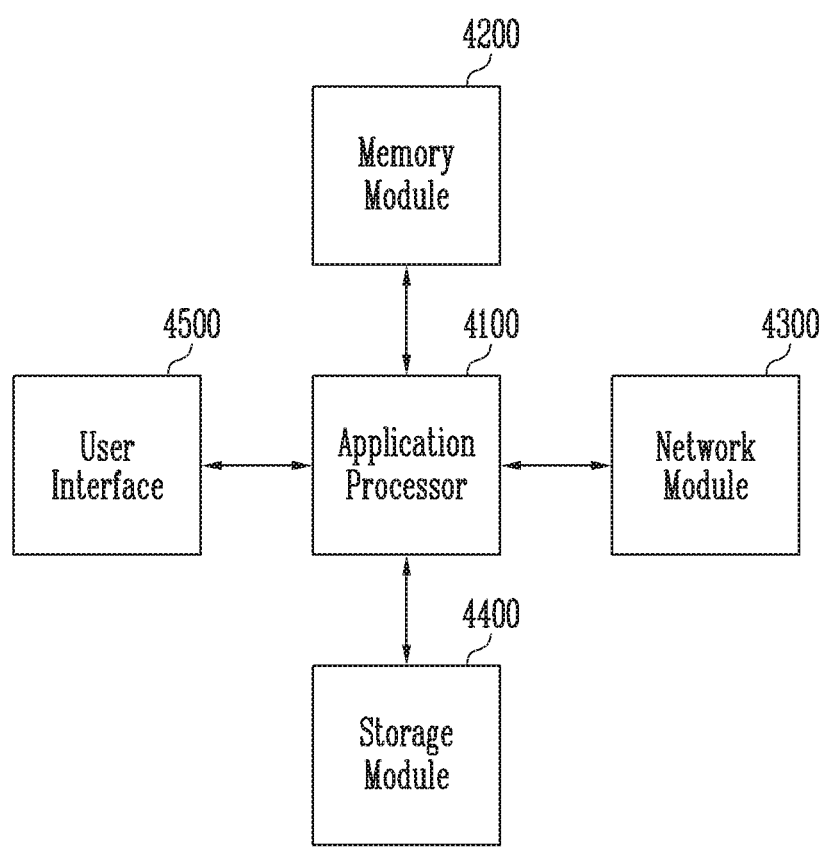
FIG. 18 is a block diagram illustrating a user system to which the storage device is applied in accordance with an embodiment of the present disclosure.

FIG. 18 is a block diagram illustrating a user system to which the storage device is applied in accordance with an embodiment of the present disclosure.

Referring to FIG. 18, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with embodiments of the present disclosure, a memory device having improved read reliability and an operating method thereof are provided.

What is claimed is:

1. A memory device comprising:
   first blocks coupled to a first global line group and second blocks coupled to a second global line group;
   a voltage generator configured to generate an operating voltage for an operation performed on the first blocks and the second blocks;
   a block decoder configured to generate a block select signal for selecting a memory block on which a main operation is to be performed from among the first blocks as a selected block; and
   a block voltage controller configured to control the block decoder and the voltage generator to:
   perform a channel initializing operation of discharging channel regions of the selected block and a shared block which is selected from among the second blocks according to the block select signal; and
   perform a word line floating operation on the selected block and the shared block after the channel initializing operation, and
   wherein the word line floating operation floats word lines of the selected block and the shared block to a positive bias.

2. The memory device of claim 1, further comprising:
   a first pass switch configured to couple the first global line group to a local line group of the selected block; and
   a second pass switch configured to couple the second global line group to a local line group of the shared block.

3. The memory device of claim 2, wherein the block decoder controls a pass switching circuit including the first pass switch and the second pass switch by using the block select signal.

4. The memory device of claim 3, wherein, during the channel initializing operation, the block voltage controller controls the block decoder and the voltage generator to apply a set voltage to the local line group of the selected block and the local line group of the shared block.

5. The memory device of claim 4,
   wherein the voltage generator generates the set voltage to be applied to the first global line group and the second global line group,
   wherein the block decoder transfers the set voltage applied to the first global line group and the second global line group to the local line group of the selected block and the local line group of the shared block by controlling the pass switching circuit.

6. The memory device of claim 4, wherein the set voltage has a positive magnitude.

7. The memory device of claim 4, wherein, during the word line floating operation, the block voltage controller controls the block decoder and the voltage generator to discharge, a voltage level of each of the first global line group and the second global line group to a ground voltage level.

8. The memory device of claim 7,
   wherein the first global line group includes a first global source select line, first global word lines, and a first global drain select line, and
   wherein the second global line group includes a second global source select line, second global word lines, and a second global drain select line.

9. The memory device of claim 8, wherein the word line floating operation comprises a first discharge operation and a second discharge operation,
   wherein the first discharge operation discharges a voltage level of each of the first and second global source select lines and the first and second global drain select lines to the ground voltage level, and
   wherein the second discharge operation discharges a level of the block select signal to the ground voltage level.

10. The memory device of claim 9, wherein the word line floating operation further comprises a third discharge operation, and
    wherein the third discharge operation discharges a voltage level of each of the first global word lines and the second global word lines to the ground voltage level.

11. The memory device of claim 1, wherein the main operation includes one of a read operation, a program operation, and an erase operation.

12. A method for operating a memory device including a first block coupled to a first global line group through a first pass switch and a second block coupled to a second global line group through a second pass switch, the method comprising:
    performing a main operation on the first block that is selected according to a block select signal among the first block and the second block;
    performing a channel initializing operation of discharging channel regions of the first block and the second block; and
    performing a word line floating operation of floating word lines of the first block and the second block to a positive bias after the channel initializing operation.

13. The method of claim 12, wherein the performing of the channel initializing operation includes:
    applying a set voltage to the first global line group and the second global line group; and
    transferring the set voltage applied to the first global line group and the second global line group to a local line group of the first block and a local line group of the second block by controlling the first pass switch and the second pass switch.

14. The method of claim 13, wherein each of the local line group of the first block and the local line group of the second block includes a source select line, the word lines, and a drain select line.

15. The method of claim 13, wherein the set voltage has a positive magnitude.

16. The method of claim 13, wherein the first pass switch and the second pass switch are controlled by the block select signal.

17. The method of claim 12, wherein the performing of the word line floating operation includes:
    discharging a voltage level of global source select lines and global drain select lines included in the first global line group and the second global line group to a ground voltage level; and
    discharging a level of the block select signal to the ground voltage level; and
    discharging, to the ground voltage level, the set voltage applied to global word lines respectively included in the first global line group and the second global line group, in the channel initializing operation.

18. The method of claim 17, wherein the performing of the word line floating operation further includes discharging a voltage level of global word lines included in the first global line group and the second global line group to the ground voltage level.

19. The method of claim 12, wherein the main operation includes one of a read operation, a program operation, and an erase operation.

20. The method of claim 12, wherein the performing of the main operation includes:
- generating a main operating voltage for performing the main operation;
- applying the main operating voltage to the first global line group; and
- transferring the main operating voltage applied to the first global line group to the local line group of the first block by controlling the first pass switch.

* * * * *